(12) United States Patent
Nishimura

(10) Patent No.: US 6,809,592 B2
(45) Date of Patent: Oct. 26, 2004

(54) HIGH-FREQUENCY CIRCUIT

(75) Inventor: Yoshikazu Nishimura, Kawasaki (JP)

(73) Assignee: NEC Compound Semiconductor Devices, Ltd. (JP)

( * ) Notice: Subject to any disclaimer, the term of this patent is extended or adjusted under 35 U.S.C. 154(b) by 0 days.

(21) Appl. No.: 10/324,404

(22) Filed: Dec. 19, 2002

(65) Prior Publication Data

US 2003/0112074 A1 Jun. 19, 2003

(30) Foreign Application Priority Data

Dec. 19, 2001 (JP) ........................................ 2001-386201

(51) Int. Cl.[7] .............................................. H03G 3/30
(52) U.S. Cl. ........................ 330/285; 330/278; 330/296
(58) Field of Search ................................ 330/129, 273, 330/278, 279, 285, 296

(56) References Cited

U.S. PATENT DOCUMENTS

| | | | | |
|---|---|---|---|---|
| 5,670,912 A | * | 9/1997 | Zocher | 330/296 |
| 5,774,017 A | | 6/1998 | Adar | 330/51 |
| 6,496,073 B2 | * | 12/2002 | Choi | 330/285 |
| 6,518,840 B1 | * | 2/2003 | Rahn et al. | 330/285 |
| 2001/0011926 A1 | | 8/2001 | Adar | 330/126 |

FOREIGN PATENT DOCUMENTS

| | | | |
|---|---|---|---|
| EP | 0609053 | 1/1994 | H03F/1/30 |
| JP | 10-65466 | 3/1998 | H03F/3/60 |
| JP | 10-313259 | 11/1998 | H04B/1/26 |

OTHER PUBLICATIONS

"A Digital FDD Transceiver System for 900MHz ISM Band Applications" Durec et al., Wireless Communications Conference, pp. 50–56.

"A High Efficiency Single Chain GaAs MESFET MMIC Dual Band Power Amplifier for GSM/DCS Handsets" Adar et al, Article, 1998, pp.69–72.

* cited by examiner

*Primary Examiner*—Khanh Van Nguyen
(74) *Attorney, Agent, or Firm*—Hayes Soloway P.C.

(57) ABSTRACT

A high-frequency circuit includes a bias circuit to which a gain control voltage is input and which controls gains of transistors arranged in the bias circuit in accordance with the gain control voltage, and a band-switching circuit which switches a band and through which a reference current runs. The band-switching circuit includes two transistors electrically connected in cascode to each other, one of the two transistors which is located downstream of the other has a gate electrically connected to a gain control voltage terminal through which the gain control voltage is input, and each of the two transistors is comprised of a complete enhancement mode field effect transistor. The bias circuit includes a pair of transistors and a band-switching transistor. The band-switching transistor is electrically connected in series to a line through which the gain control voltage is supplied, and the gain control voltage is applied to the pair of transistors through the band-switching circuit.

5 Claims, 2 Drawing Sheets

HIGH-FREQUENCY CIRCUIT

BACKGROUND OF THE INVENTION

1. Field of the Invention

The invention relates to a high-frequency circuit having a function of switching a band in a plurality of circuit blocks each of which deals with a high-frequency signal.

2. Description of the Related Art

FIG. 1 is a circuit diagram of a conventional high-frequency circuit 40 for driving one of bands in a power amplifier which accomplishes a dual-band power amplification module.

The illustrated high-frequency circuit 40 is comprised of a main transistor 50, a bias circuit 51 which supplies a current to a base of the main transistor 50, a band-switching circuit 52 for switching a band, and a gain control circuit 53.

The main transistor 50 is electrically connected through a collector thereof to a power source voltage terminal Vcc through which a power source voltage is supplied, and further electrically connected through a base thereof to an input terminal Vin through which a high-frequency signal is input.

The bias circuit 51 is comprised of a first transistor 54, a second transistor 55, and a first resistor 56.

The first transistor 54 is electrically connected through a collector thereof to the power source voltage terminal Vcc, and further electrically connected through an emitter thereof to both a base of the main transistor 50 and a base of the second transistor 55.

The second transistor 55 is electrically connected through a collector thereof to the power source voltage terminal Vcc through the first resistor 56, and further electrically connected through a base thereof to both a base of the main transistor 50 and an emitter of the first transistor 54.

The band-switching circuit 52 is comprised of a third transistor 57, a fourth transistor 58, a fifth transistor 59, a second resistor 60, a third resistor 61, and a fourth resistor 62.

The third transistor 57 is electrically connected through a base thereof to a band-switching voltage terminal Vsw through which a band-switching voltage is supplied, through the second resistor 60, and further electrically connected through a collector thereof to the power source voltage terminal Vcc through the third resistor 61.

The fourth transistor 58 is electrically connected through a base thereof to a node D at which a collector of the third transistor 57 and the third resistor 61 are electrically connected to each other, and further electrically connected through a collector thereof to the power source voltage terminal Vcc through the fourth resistor 62.

The fifth transistor 59 is electrically connected through a base thereof to a node at which a collector of the fourth transistor 58 and the fourth resistor 62 are electrically connected to each other, and further electrically connected through a collector thereof to a node at which a collector of the second transistor 55 and the first resistor 56 are electrically connected to each other.

The gain control circuit 53 is electrically connected to a gain control voltage terminal Vagc through which a gain control voltage is supplied, and further electrically connected to a node C at which a collector of the fifth transistor 59 and a node at which a collector of the second transistor 55 and the first resistor 56 are electrically connected to each other are electrically connected to each other.

In the conventional high-frequency circuit 40 illustrated in FIG. 1, a gain of the main transistor 50 is controlled by the gain control circuit 53, and a band is switched when a band-switching voltage supplied through the band-switching voltage terminal Vsw is changed between high and low levels. Specifically, a band is turned off when a reference current $I_1$ running through the bias circuit 51 runs through the fifth transistor 59 as a current $I_2$, whereas a band is turned off when a path through which the current $I_2$ runs is interrupted. Thus, a band is switched on or off by allowing the reference current $I_1$ to run through a path or interrupting the path.

The conventional high-frequency circuit 40 illustrated in FIG. 1, for instance, receives a plurality of high-frequency signals which are identical with one another or different from one another, and then, amplifies each of the received high-frequency signals, or converts frequencies of the received high-frequency signals.

A high-frequency circuit such as one illustrated in FIG. 1 is presently frequently used in a mobile communication device such as a cellular phone.

It is quite important for a cellular phone driven by a battery arranged therein, to be fabricated in a smaller size and designed to be driven with smaller power consumption.

To this end, the high-frequency circuit 40 illustrated in FIG. 1 is required to reduce a current running through the power source voltage terminal Vcc down to a range of about 10 to about 30 $\mu$A when the gain control voltage is lowered to 0.1V. A smaller current running through the power source voltage terminal Vcc is more preferable, since the current defines a period of time in which a battery arranged in a cellular phone can work.

However, a band in the conventional high-frequency circuit 40 illustrated in FIG. 1 was switched merely by converting a direction in which the reference current $I_1$ ran, and accordingly, it was not possible in the conventional high-frequency circuit 40 to reduce a current running through the power supply voltage terminal Vcc when a gain control voltage was set at 0.1V.

Japanese Unexamined Patent Publication No. 10-65466, which is based on the U.S. patent application Ser. No. 08/664,972 filed on Jun. 3, 1996, has suggested an amplifier for amplifying a signal having one of predetermined frequencies. The suggested amplifier is comprised of a plurality of amplifying units each of which operates under one of the predetermined frequencies, and a controller which allows one of amplifying units to operate in accordance with one of the predetermined frequencies, and disallows the rest of the amplifying units to operate.

Japanese Unexamined Patent Publication No. 10-313259 has suggested a high-frequency circuit comprised of a plurality of circuit blocks into which received radio-frequency signals are input. Each of the circuit blocks includes a DC switching transistor which interrupts a current path through which a dc bias current runs in a circuit block in accordance with a received signal indicating that the circuit block is not selected.

The above-mentioned problem remains unsolved even in the above-identified Publications.

SUMMARY OF THE INVENTION

In view of the above-mentioned problems in the conventional high-frequency circuits, it is an object of the present invention to provide a high-frequency circuit which is capable of reducing a current running through a power supply voltage terminal down to tens of microamperes (μA), even if a gain control voltage is relatively low, for instance, at about 0.1V.

The present invention provides a high-frequency circuit having a function of switching a band in a bias circuit of a power amplifier module, used in a dual mode, and accomplishing band-switching without an increase in a circuit current when a power amplifier is off.

There is provided a high-frequency circuit including (a) a bias circuit to which a gain control voltage is input and which controls gains of transistors arranged in the bias circuit in accordance with the gain control voltage, and (b) a band-switching circuit which switches a band and through which a reference current runs, wherein the band-switching circuit includes a transistor which cuts off a current path through which the reference current runs, in synchronization with the gain control voltage.

There is provided a high-frequency circuit including (a) a bias circuit to which a gain control voltage is input and which controls gains of transistors arranged in the bias circuit in accordance with the gain control voltage, and (b) a band-switching circuit which switches a band and through which a reference current runs, wherein the band-switching circuit includes two transistors electrically connected in cascode to each other, one of the two transistors which is located downstream of the other has a gate electrically connected to a gain control voltage terminal through which the gain control voltage is input, and each of the two transistors is comprised of a complete enhancement mode field effect transistor.

There is provided a high-frequency circuit including (a) a bias circuit to which a gain control voltage is input and which controls gains of transistors arranged in the bias circuit in accordance with the gain control voltage, and (b) a band-switching circuit which switches a band and through which a reference current runs, wherein the bias circuit includes at least one pair of transistors and a band-switching transistor used for switching a band, the band-switching transistor is electrically connected in series to a line through which the gain control voltage is supplied, and the gain control voltage is applied to the pair of transistors through the band-switching transistor.

The bias circuit may be designed to include at least one pair of transistors and a band-switching transistor used for switching a band, in which case, the band-switching transistor is electrically connected in series to a line through which the gain control voltage is supplied, and the gain control voltage is applied to the pair of transistors through the band-switching transistor.

The advantages obtained by the aforementioned present invention will be described hereinbelow.

The high-frequency circuit in accordance with the present invention makes it possible to reduce a current running through a power supply voltage terminal down to tens of microamperes (μA), even if a gain control voltage is relatively low, for instance, at about 0.1V.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENT

A preferred embodiment in accordance with the present invention is explained hereinbelow with reference to drawings.

Figure 1:
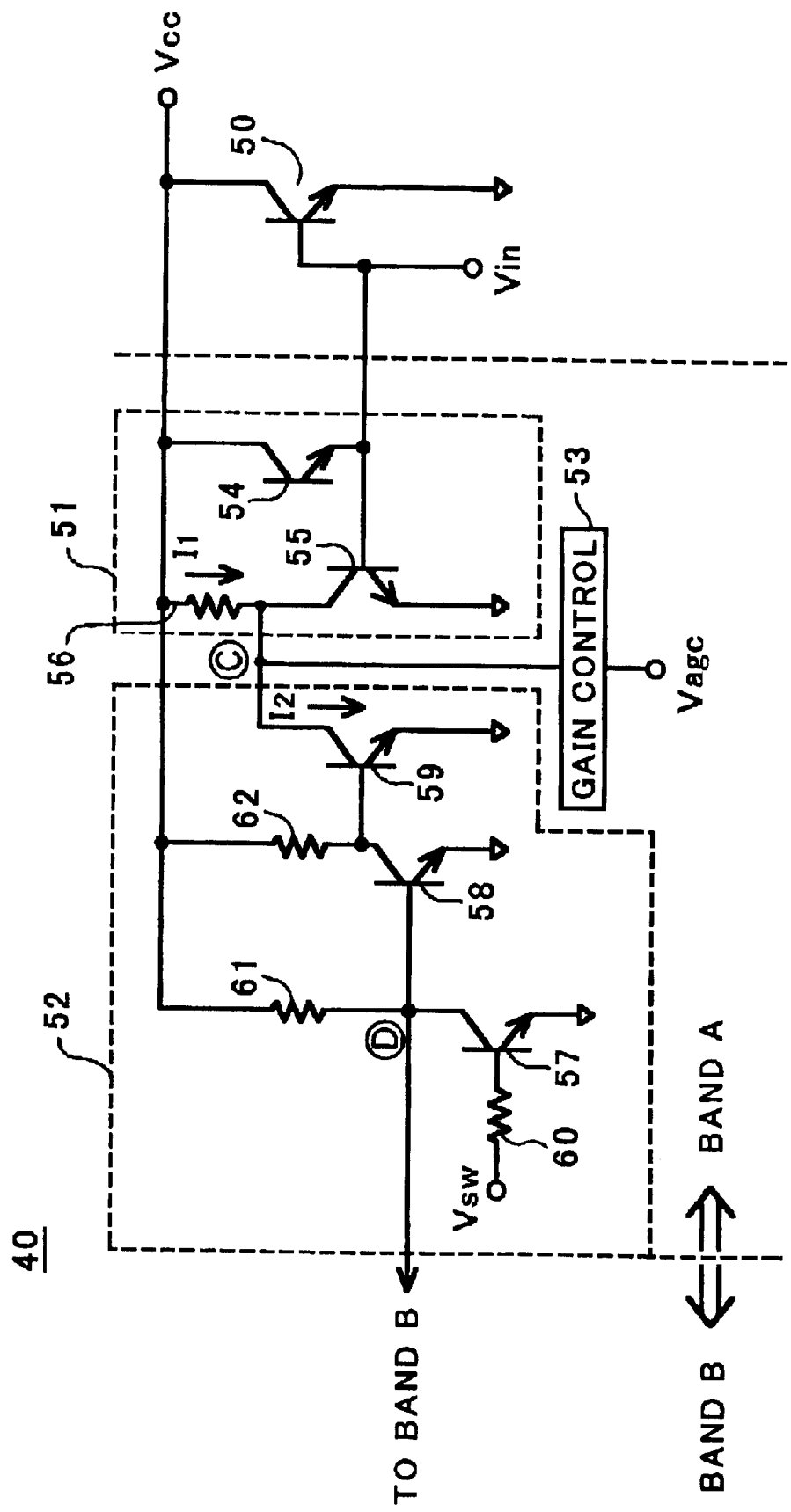
FIG. 1 is a circuit diagram of a conventional high-frequency circuit.
Figure 2:
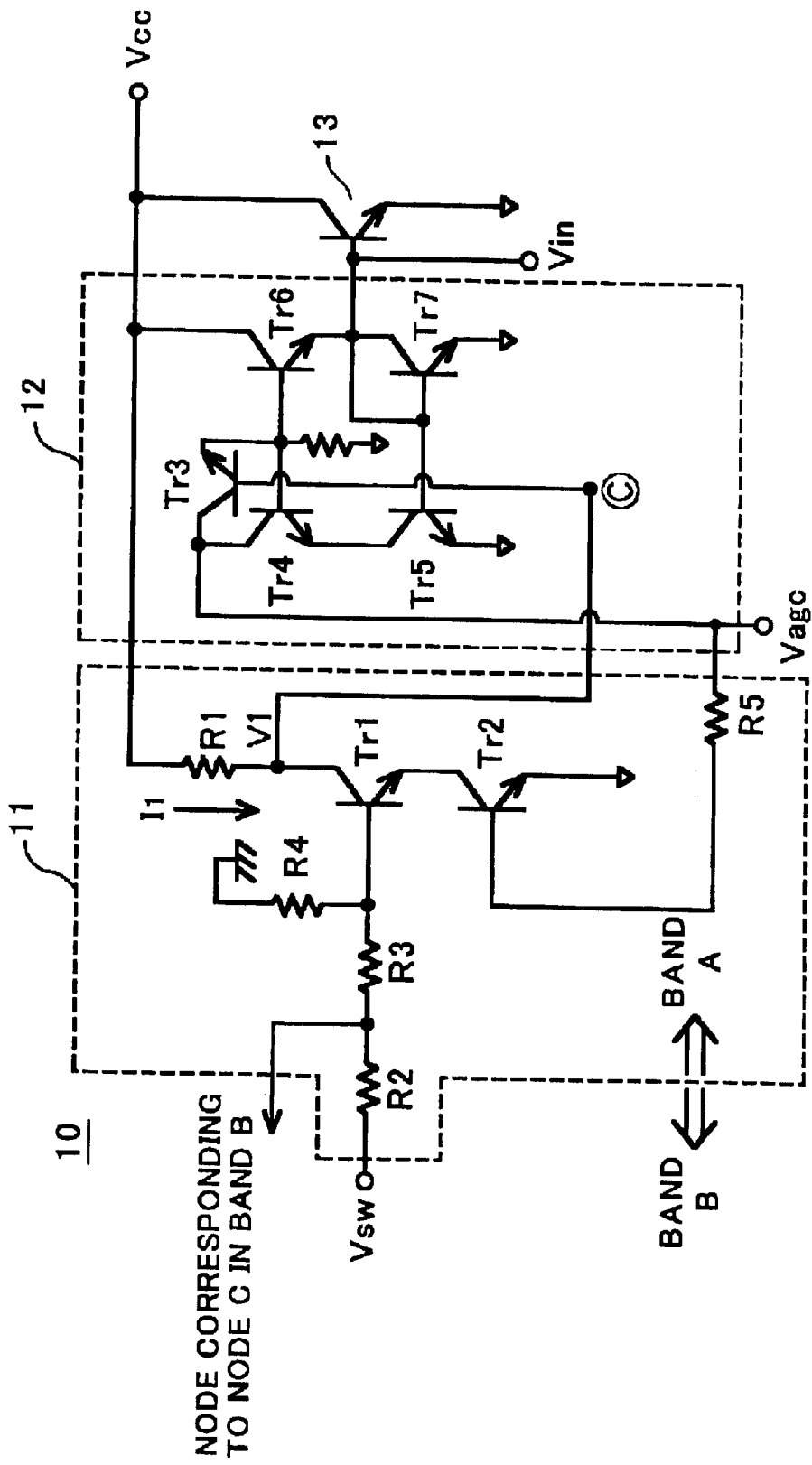
FIG. 2 is a circuit diagram of a high-frequency circuit in accordance with the embodiment of the present invention.

FIG. 2 is a circuit diagram of a high-frequency circuit 10 in accordance with an embodiment of the present invention.

The high-frequency circuit 10 in accordance with the embodiment is comprised of a band-switching circuit 11 for switching a band, a bias circuit 12, and a main transistor 13.

The band-switching circuit 11 is comprised of a first transistor Tr1, a second transistor Tr2, a first resistor R1, a second resistor R2, a third resistor R3, a fourth resistor R4, and a fifth resistor R5.

Each of the first and second transistors Tr1 and Tr2 is comprised of field effect transistors (FETs).

The first transistor Tr1 has: a gate electrically connected through the third and second resistors R2 and R3 to a switching voltage terminal Vsw through which a band-switching voltage is supplied, an emitter electrically connected to a collector of the second transistor Tr2, and a collector electrically connected through the first resistor R1 to a power supply voltage terminal Vcc through which a power supply voltage is supplied.

The second transistor Tr2 has: a collector electrically connected to an emitter of the first transistor Tr1, and a gate electrically connected through the fifth resistor R5 to a gain control voltage terminal Vagc through which a gain control voltage is supplied.

The fourth resistor R4 is electrically connected at one end to a node at which a gate of the first transistor Tr1 and the third resistor R3 are electrically connected to each other, and is grounded at the other end.

The bias circuit 12 is comprised of a third transistor Tr3, a fourth transistor Tr4, a fifth transistor Tr5, a sixth transistor Tr6, and a seventh transistor Tr7.

The third transistor Tr3 has: a collector electrically connected to the gain control voltage terminal Vagc, and a base electrically connected to a node at which a collector of the first transistor Tr1 and the first resistor R1 are electrically connected to each other.

The fourth transistor Tr4 and the fifth transistor Tr5 are electrically connected in series to each other. Similarly, the sixth transistor Tr6 and the seventh transistor Tr7 are electrically connected in series to each other. The fourth transistor Tr4 and the sixth transistor Tr6 form a transistor pair, and the fifth transistor Tr5 and the seventh transistor Tr7 form a transistor pair.

Specifically, the fourth transistor Tr4 has: a collector electrically connected to a collector of the third transistor Tr3, an emitter electrically connected to a collector of the fifth transistor Tr5, and a base electrically connected to a base of the sixth transistor Tr6.

The fifth transistor Tr5 has: a collector electrically connected to an emitter of the fourth transistor Tr4, and a base electrically connected to a base of the seventh transistor Tr7.

The sixth transistor Tr6 has: a collector electrically connected to the power supply voltage terminal Vcc, an emitter electrically connected to a collector of the seventh transistor Tr7, and a base electrically connected to a base of the fourth transistor Tr4.

The seventh transistor Tr7 has: a collector electrically connected to an emitter of the sixth transistor Tr6, and a base electrically connected to a base of the fifth transistor Tr5.

The main transistor 13 has: a collector electrically connected to the power supply voltage terminal Vcc, and a base electrically connected to both a node at which an emitter of the sixth transistor Tr6 and a collector of the seventh transistor Tr7 are electrically connected to each other, and a node at which a base of the seventh transistor Tr7 and a base of the fifth transistor Tr5 are electrically connected to each other.

In the high-frequency circuit 10 in accordance with the embodiment, a high-frequency signal input through an input terminal Vin is amplified by the two transistor pairs Tr4, Tr6 and Tr5, Tr7, and then, output to the power supply voltage terminal Vcc. The two transistor pairs Tr4, Tr6 and Tr5, Tr7 accomplish band-switching without an increase in a circuit current running in the high-frequency circuit 10, which is turned into an off-mode by the gain control voltage.

The high-frequency circuit 10 is controlled by both the band-switching voltage and the gain control voltage in accordance with the following logic.

| Vsw | L | | H | |
|---|---|---|---|---|
| Vagc | L | H | L | H |
| Band A | OFF | ON | OFF | OFF |
| Band B | OFF | OFF | OFF | ON |

Hereinbelow is explained an operation of the high-frequency circuit 10 in accordance with the embodiment.

For instance, it is assumed that a gain control voltage of 2.0V is applied to the high-frequency circuit 10 through the gain control voltage terminal Vagc, and a voltage of 3.5V is applied to both of the transistor pair Tr4 and Tr6 and the transistor pair Tr5 and Tr7 through the power supply voltage terminal Vcc. Under the assumption, a current to run through the transistor pair Tr4 and Tr6 and the transistor pair Tr5 and Tr7 is dependent on a current running through a reference branch.

In such a circuit including two transistor pairs defining a dual band as the high-frequency circuit 10, it would be necessary to switch a band, that is, switching on or off of transistors defining the transistor pairs. In the high-frequency circuit 10, band-switching is carried out by the band-switching circuit 11 comprised of the first to fifth resistors R1 to R5, the first transistor Tr1 and the second transistor Tr2.

For instance, when a band-switching voltage input through the band-switching voltage terminal Vsw is in a low level (for instance, 1.0V), the first transistor Tr1 is turned off. Thus a voltage V1 appears at a node in which a collector of the first transistor Tr1 and the first resistor R1 are electrically connected to each other. A high voltage V1 at this node causes the third transistor Tr3 to be turned on. As a result, the transistor pairs arranged in a first band A are turned on.

When the gain control voltage is in off condition, for instance, equal to 0.1V, the first transistor Tr1 is turned off. Accordingly, the reference current $I_i$ does not run through the first transistor Tr1, and hence, a current does not run through the power supply voltage terminal Vcc.

When the band-switching voltage input through the band-switching voltage terminal Vsw is in a high level (for instance, 3.0V), the first transistor Tr1 is turned on. This causes that the voltage V1 is turned into a low level, and thus, the third transistor Tr3 is turned off. As a result, the transistor pairs arranged in the first band A are turned off.

Since the band-switching voltage at a high level is applied further to a transistor corresponding to the third transistor Tr3, arranged in a second band B, the transistor pairs arranged in the second band B are turned on.

When the gain control voltage is in off condition, for instance, equal to 0.1V, the first transistor Tr1 is on, in which case, it would be possible to reduce a current running through the power supply voltage terminal Vcc down to zero if: each of the first and second transistors Tr1 and Tr2 is comprised of a complete enhancement mode field effect transistor (FET) having a threshold voltage of 0.1V, preferably 0.2V, the gain control voltage terminal Vagc is electrically connected to a gate of the second transistor Tr2, and the second transistor Tr2 is closed in accordance with the gain control voltage.

As having been explained so far, in the high-frequency circuit 10 in accordance with the embodiment, the band-switching circuit 11 is designed to include: the first and second transistors Tr1 and Tr2 electrically connected in cascode to each other, a gate of the second transistor Tr2 located downstream of the first transistor Tr1 in the band-switching circuit 11 which is electrically connected to the gain control voltage terminal Vagc, and in addition, each of the first and second transistors Tr1 and Tr2 is comprised of a complete enhancement mode field effect transistor (FET). As a result, the high-frequency circuit 10 can switch a band without an increase in a circuit current, caused by the bias circuit 12, when the gain control voltage is in off-mode.

In the above-mentioned embodiment, though each of the first and second transistors Tr1 and Tr2 is comprised of a field effect transistor, it should be noted that each of the first and second transistors Tr1 and Tr2 may be comprised of a bipolar transistor.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2001-386201 filed on Dec. 19, 2001 including specification, claims, drawings and summary is incorporated herein by reference in its entirety.

What is claimed is:

1. A high-frequency circuit comprising:
   (a) a bias circuit to which a gain control voltage is input and which controls gains of more than one transistor arranged in said bias circuit in accordance with said gain control voltage; and
   (b) a band-switching circuit which switches a band according to a band-switching voltage input into said band-switching circuit and through which a reference current runs,
   wherein said band-switching circuit includes a transistor which cuts off a current path through which said reference current runs, in synchronization with said gain control voltage.

2. The high-frequency circuit as set forth in claim 1, wherein said bias circuit includes at least one pair of transistors and a band-switching transistor used for switching a band, said band-switching transistor is electrically connected in series to a line through which said gain control voltage is supplied, and said gain control voltage is applied to said pair of transistors through said band-switching transistor.

3. A high-frequency circuit comprising:

(a) a bias circuit to which a gain control voltage is input and which controls gains of transistors arranged in said bias circuit in accordance with said gain control voltage; and (b) a band-switching circuit which switches a band and through which a reference current runs, wherein said band-switching circuit includes two transistors electrically connected in cascode to each other, one of said two transistors which is located downstream of the other has a gate electrically connected to a gain control voltage terminal through which said gain control voltage is input, and each of said two transistors is comprised of a complete enhancement mode field effect transistor.

4. The high-frequency circuit as set forth in claim 3, wherein said bias circuit includes at least one pair of transistors and a band-switching transistor used for switching a band, said band-switching transistor is electrically connected in series to a line through which said gain control voltage is supplied, and said gain control voltage is applied to said pair of transistors through said band-switching transistor.

5. A high-frequency circuit comprising:

(a) a bias circuit to which a gain control voltage is input and which controls gains of transistors arranged in said bias circuit in accordance with said gain control voltage; and (b) a band-switching circuit which switches a band and through which a reference current runs;

wherein said bias circuit includes at least one pair of transistors and a band-switching transistor used for switching a band, said band-switching transistor is electrically connected in series to a line through which said gain control voltage is supplied, and said gain control voltage is applied to said pair of transistors through said band-switching transistor.

* * * * *